(12) United States Patent
Ito

(10) Patent No.: US 12,006,968 B2
(45) Date of Patent: Jun. 11, 2024

(54) COMPONENT MOUNTING DEVICE

(71) Applicant: YAMAHA HATSUDOKI KABUSHIKI KAISHA, Iwata (JP)

(72) Inventor: Kota Ito, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 494 days.

(21) Appl. No.: 17/603,222

(22) PCT Filed: Apr. 23, 2019

(86) PCT No.: PCT/JP2019/017157
§ 371 (c)(1),
(2) Date: Oct. 12, 2021

(87) PCT Pub. No.: WO2020/217296
PCT Pub. Date: Oct. 29, 2020

(65) Prior Publication Data
US 2022/0186760 A1 Jun. 16, 2022

(51) Int. Cl.
*B23P 19/00* (2006.01)
*F16B 7/04* (2006.01)
*G06T 7/00* (2017.01)
*H05K 13/04* (2006.01)
*H05K 13/08* (2006.01)

(52) U.S. Cl.
CPC .......... *F16B 7/0406* (2013.01); *G06T 7/0004* (2013.01); *H05K 13/0409* (2018.08); *H05K 13/0812* (2018.08); *G06T 2207/30164* (2013.01)

(58) Field of Classification Search
CPC ............... H05K 13/04; H05K 13/0409; H05K 13/0812; F16B 7/0004; F16B 7/0406; G06T 2207/10152; G06T 2207/30164
See application file for complete search history.

(56) References Cited

U.S. PATENT DOCUMENTS

| | | | | |
|---|---|---|---|---|
| 6,527,322 B2 * | 3/2003 | Suhara | ............... | H05K 13/0409 294/185 |
| 10,798,857 B2 * | 10/2020 | Awano | ............... | H05K 13/0408 |
| 11,224,151 B2 * | 1/2022 | Awano | .................. | H01L 21/683 |

(Continued)

FOREIGN PATENT DOCUMENTS

| | | |
|---|---|---|
| CN | 1777357 A | 5/2006 |
| CN | 1791325 A | 6/2006 |
| CN | 103037678 A | 4/2013 |

(Continued)

OTHER PUBLICATIONS

Yang Hongtian et al., "The Research on SMD Positional Correction Algorithm of High-precision Chip Mounter," Journal of Guangdong Industry Technical College, vol. 11, No. 2, pp. 6-10, Jun. 15, 2012; with Englilsh abstract on p. 10.

(Continued)

*Primary Examiner* — Paul D Kim
(74) *Attorney, Agent, or Firm* — Studebaker & Brackett PC

(57) ABSTRACT

A component mounting device includes a nozzle shaft. The nozzle shaft includes a filter and a filter state checking portion. The filter state checking portion is configured to allow light to pass therethrough from a first side to a second side of the nozzle shaft in an axially orthogonal direction according to an inserted state of the filter.

20 Claims, 9 Drawing Sheets

(56) References Cited

U.S. PATENT DOCUMENTS

| | | | |
|---|---|---|---|
| 2006/0053624 A1* | 3/2006 | Maeda | ............... H05K 13/0409 29/832 |
| 2018/0271000 A1 | 9/2018 | Awano | |

FOREIGN PATENT DOCUMENTS

| CN | 104206046 A | 12/2014 |
|---|---|---|
| CN | 106031327 A | 10/2016 |
| CN | 107852850 A | 3/2018 |
| CN | 109297407 A | 2/2019 |
| DE | 11 2015 006913 T5 | 5/2018 |
| JP | H09-89523 A | 4/1997 |
| JP | 2003-101292 A | 4/2003 |
| JP | 2003-224397 A | 8/2003 |
| JP | 2004-158760 A | 6/2004 |
| JP | 2008-218706 A | 9/2008 |
| JP | 2010-133717 A | 6/2010 |
| JP | 2013-078829 A | 5/2013 |
| JP | 2017-027997 A | 2/2017 |
| JP | 2018-160481 A | 10/2018 |
| JP | 6452832 B2 | 1/2019 |
| WO | 2017/046919 A1 | 3/2017 |
| WO | 2017/094167 A1 | 6/2017 |
| WO | 2018/179048 A1 | 10/2018 |
| WO | 2019/003386 A1 | 1/2019 |

OTHER PUBLICATIONS

Hou Zong-Zong et al., "Structure Optimization for Filter Nozzle Based on CFD Technology," Internal Combustion Engine and Parts, No. 21, pp. 90-92, Nov. 15, 2018; with English abstract on p. 90.

An Office Action mailed by China National Intellectual Property Administration on Aug. 12, 2022, which corresponds to Chinese Patent Application No. 201980094143.4 and is related to U.S. Appl. No. 17/603,222; with English language translation.

International Search Report issued in PCT/JP2019/017157; mailed Jul. 2, 2019.

Written Opinion issued in PCT/JP2019/017157; mailed Jul. 2, 2019.

* cited by examiner

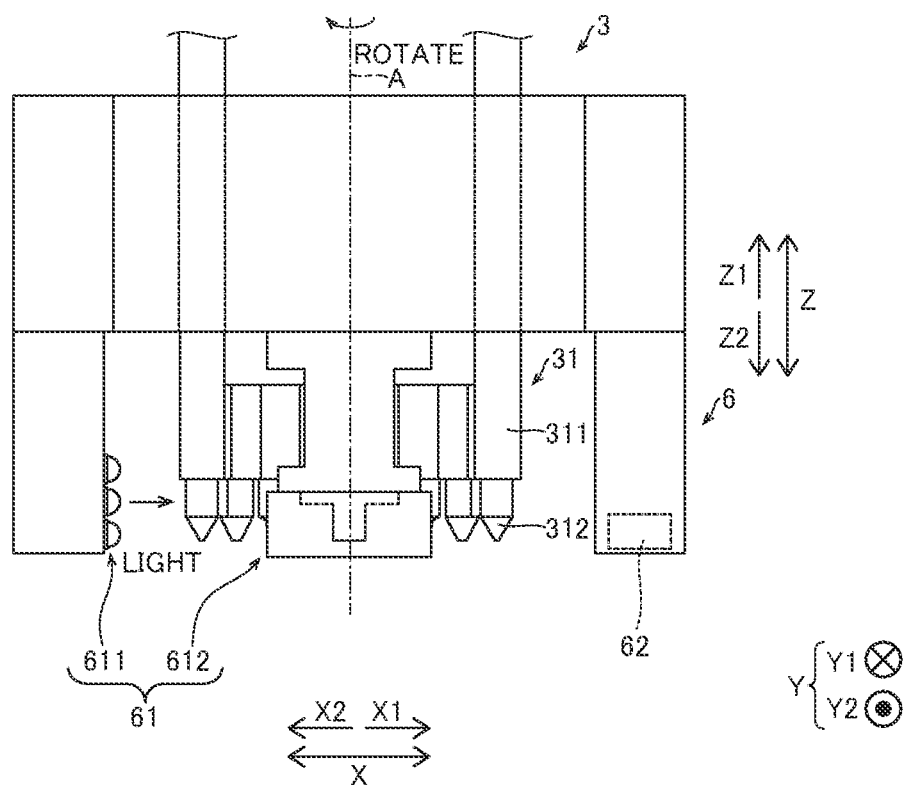

FIG.4A
FIG.4B
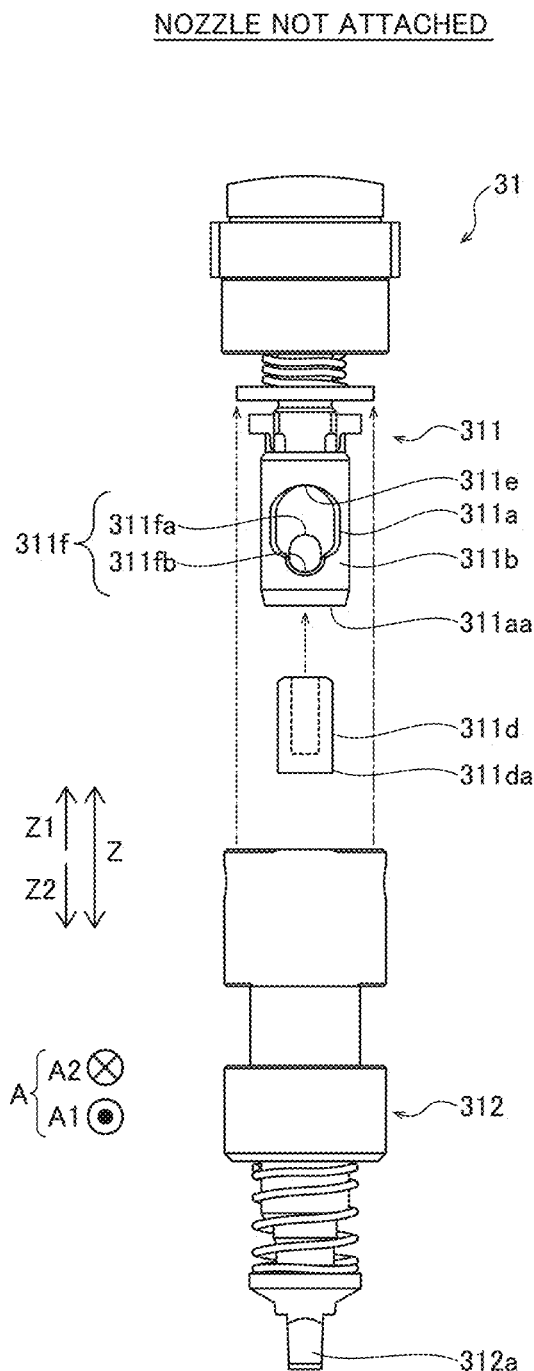
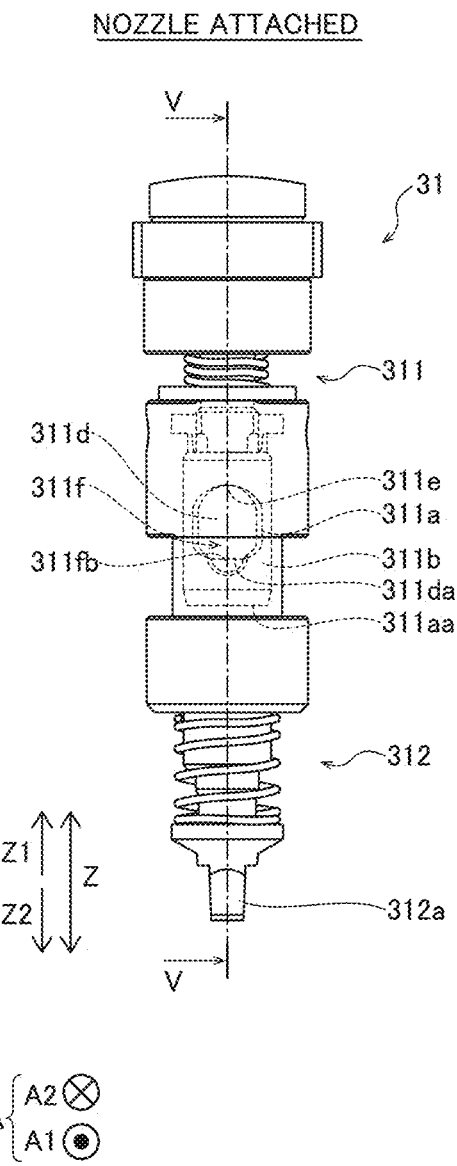

FLOW OF FLUID (DURING SUCTION)

PASSAGE OF LIGHT (DURING IMAGING)

FIG.7

FIG.9 FILTER INSERTED STATE DETECTION PROCESS
(AT TIME OF FILTER REPLACEMENT)
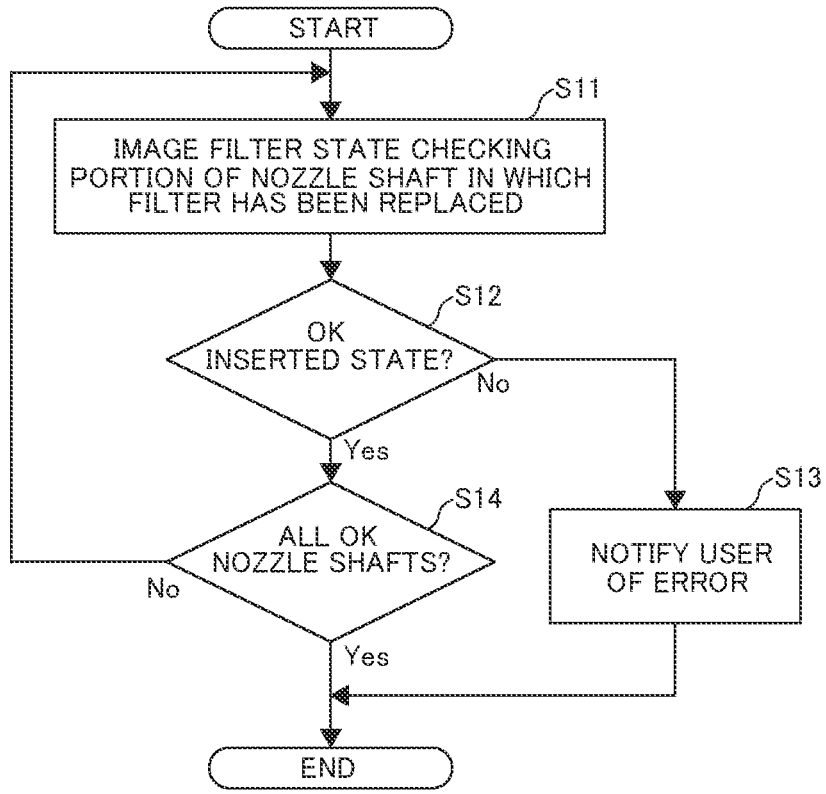
FIG.10 FILTER INSERTED STATE DETECTION PROCESS
(AT TIME OF VISUAL CONFIRMATION)
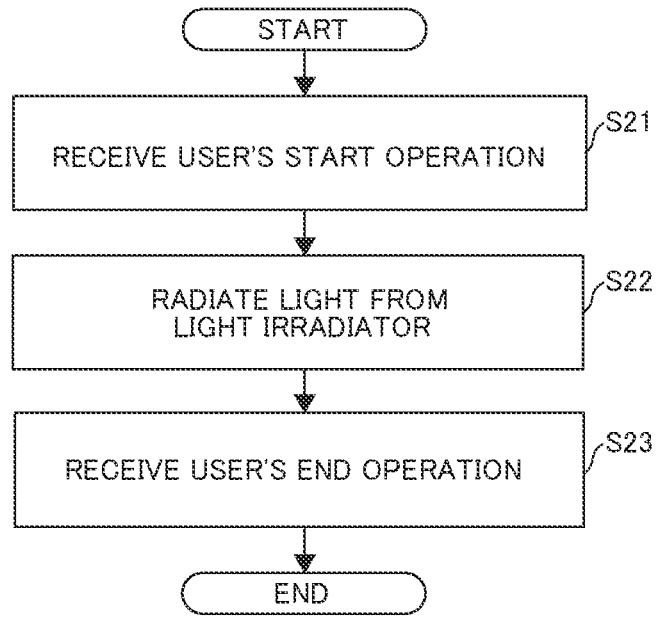

(FIRST MODIFIED EXAMPLE)

(SECOND MODIFIED EXAMPLE)

(THIRD MODIFIED EXAMPLE)

COMPONENT MOUNTING DEVICE

CROSS-REFERENCE TO RELATED APPLICATION

This application is a National Stage of International Patent Application No. PCT/JP2019/017157, filed Apr. 23, 2019, the entire content of which is incorporated herein by reference.

BACKGROUND

Technical Field

The present disclosure relates to a component mounting device, and more particularly, it relates to a component mounting device including a filter inserted in a nozzle shaft.

Background Art

Conventionally, a component mounting device including a filter inserted in a nozzle shaft is known. Such a component mounting device is disclosed in International Publication No. 2018/179048, for example.

International Publication No. 2018/179048 discloses a surface mounter (component mounting device) that suctions components and mounts the components on a printed circuit board. This surface mounter includes nozzle shafts and suction nozzles configured to be attachable to and detachable from the nozzle shafts and suction the components. Furthermore, dust collecting filters are inserted inside the nozzle shafts. This surface mounter is configured to image the insides of the nozzle shafts with a camera and determine the quality of the inserted states of the filters inside the nozzle shafts based on the results of imaging of the insides of the nozzle shafts by the camera.

International Publication No. 2018/179048 also discloses a configuration in which the insides of the nozzle shafts are imaged from below by the camera through openings that opens to lower portions of the nozzle shafts, and a configuration in which the insides of the nozzle shafts are imaged from the side by the camera through openings that opens to the sides of the nozzle shafts regarding filter imaging. It is conceivable that in any of these configurations of this surface mounter, the filters inside the nozzle shafts may be imaged using light reflected from surfaces of the filters, and the quality of the inserted states of the filters inside the nozzle shafts may be determined.

SUMMARY

However, in the surface mounter described in International Publication No. 2018/179048, it is conceivable that the quality of the inserted states of the filters inside the nozzle shafts may be checked using the light reflected from the surfaces of the filters, and thus depending on the surface conditions (dirt, color, etc.) of the filters, reflected light suitable for checking the quality of the inserted states of the filters inside the nozzle shafts may not be obtained. In this case, it is conceivably difficult to accurately check the quality of the inserted states of the filters inside the nozzle shafts. In this respect, the surface mounter described in International Publication No. 2018/179048 has room for improvement.

Accordingly, the present disclosure is to provide a component mounting device that enables the quality of the inserted state of a filter to be accurately checked.

A component mounting device according to an aspect of the present disclosure includes a nozzle shaft, and a nozzle configured to be attachable to and detachable from the nozzle shaft, the nozzle being configured to suction a component. The nozzle shaft includes a side wall, a fluid passage provided inside the side wall, a filter inserted into the fluid passage along an axial direction of the nozzle shaft, the filter being configured to be attachable to and detachable from the fluid passage, and a filter state checking portion provided in the side wall so as to face an end of the filter in a properly attached state in an axially orthogonal direction orthogonal to the axial direction of the nozzle shaft. The filter state checking portion is configured to allow light to pass therethrough from a first side to a second side of the nozzle shaft in the axially orthogonal direction according to an inserted state of the filter.

As described above, the component mounting device according to this aspect of the present disclosure includes the filter state checking portion in the side wall so as to face the end of the filter in the properly attached state in the axially orthogonal direction orthogonal to the axial direction of the nozzle shaft. Furthermore, the filter state checking portion is configured to allow light to pass therethrough from the first side to the second side of the nozzle shaft in the axially orthogonal direction according to the inserted state of the filter. Accordingly, when the position of the end of the filter facing the filter state checking portion in the axially orthogonal direction is changed in the axial direction according to the inserted state of the filter, the passing state of light in the filter state checking portion can be changed. Consequently, the passing state of light in the filter state checking portion is checked such that the quality of the inserted state of the filter can be checked. Thus, unlike a case in which the quality of the inserted state of the filter is checked using light reflected from a surface of the filter, the quality of the inserted state of the filter can be checked regardless of the surface condition (dirt, color, etc.) of the filter. Consequently, it is possible to provide the component mounting device that enables the quality of the inserted state of the filter to be accurately checked.

In the aforementioned component mounting device according to this aspect, the filter state checking portion preferably includes a hole that allows light to pass therethrough from the first side to the second side of the nozzle shaft in the axially orthogonal direction. Accordingly, the filter state checking portion can be easily configured to allow light to pass therethrough from the first side to the second side of the nozzle shaft in the axially orthogonal direction according to the inserted state of the filter.

In this case, the hole of the filter state checking portion preferably includes two through-holes that face each other in the axially orthogonal direction with the filter interposed therebetween. Accordingly, the filter state checking portion can be more easily configured to allow light to pass therethrough from the first side to the second side of the nozzle shaft in the axially orthogonal direction according to the inserted state of the filter.

In the aforementioned component mounting device according to this aspect, at least one of the two through-holes of the hole of the filter state checking portion is preferably provided so as to be continuous with a fluid passage opening for suction provided in the side wall. Accordingly, as compared with a case in which the through-holes of the hole of the filter state checking portion are provided as holes separate from the fluid passage opening, a decrease in the strength of the nozzle shaft due to the provision of the through-holes of the hole of the filter state checking portion can be significantly reduced or prevented.

The aforementioned component mounting device according to this aspect preferably further includes a light irradiator configured to irradiate the filter state checking portion with light from the first side of the nozzle shaft in the axially orthogonal direction. Accordingly, when the passing state of light in the filter state checking portion is checked, the light irradiator can irradiate the filter state checking portion with light from the first side of the nozzle shaft in the axially orthogonal direction. Consequently, as compared with a case in which the passing state of light in the filter state checking portion is checked only with natural light, the passing state of light in the filter state checking portion can be checked while the amount of light for checking the inserted state of the filter is increased. Thus, the quality of the inserted state of the filter can be more accurately checked.

In this case, the component mounting device preferably further includes a light detector configured to detect light that has been radiated by the light irradiator and has passed through the filter state checking portion, and a controller configured to perform a control to detect quality of the inserted state of the filter based on a light detection result of the light detector. Accordingly, the controller can automatically detect the quality of the inserted state of the filter. Consequently, it is possible to save an operator the trouble of visually checking the quality of the inserted state of the filter. This effect is particularly effective when the number of filters for which the quality of the inserted state should be checked is large.

In the aforementioned structure further including the light detector, the light detector preferably includes an imager configured to image the component suctioned by the nozzle in the axially orthogonal direction, and the controller is preferably configured to perform a control to detect the quality of the inserted state of the filter based on a result of imaging of the filter state checking portion by the imager. Accordingly, the existing imager can be used as a light detector that detects the light that has passed through the filter state checking portion. Consequently, it is not necessary to newly provide a light detector that detects the light that has passed through the filter state checking portion. Thus, it is possible to detect the quality of the inserted state of the filter while significantly reducing or preventing the complex structure of the component mounting device.

In the aforementioned structure in which the quality of the inserted state of the filter is detected, the controller is preferably configured to perform a control to detect, as the quality of the inserted state of the filter, that the inserted state of the filter is a normal state, the inserted state of the filter is an over-inserted state, that the inserted state of the filter is an under-inserted state, and that the inserted state of the filter is a non-inserted state. Accordingly, the quality of the inserted state of the filter can be detected appropriately and in detail according to the inserted state of the filter.

In the aforementioned structure in which the quality of the inserted state of the filter is detected, the controller is preferably configured to perform a control to detect the quality of the inserted state of the filter at a time of production start and at a time of replacement of the filter. Thus, for example, the controller performs a control to detect the quality of the inserted state of the filter at the time of production start such that the start of production can be significantly reduced or prevented when the inserted state of the filter is poor. Furthermore, for example, the controller performs a control to detect the quality of the inserted state of the filter when the filter is replaced such that the poor inserted state of the filter can be effectively detected when the filter is replaced at the timing at which the inserted state of the filter is likely to be poor.

According to the present disclosure, as described above, it is possible to provide the component mounting device that enables the quality of the inserted state of the filter to be accurately checked.

BRIEF DESCRIPTION OF THE DRAWINGS

FIG. 3 is a schematic view for illustrating a head unit and a side camera of the component mounting device according to the embodiment;

FIG. 4A is a schematic view showing a nozzle shaft with no nozzle or filter attached of the component mounting device according to the embodiment, and FIG. 4B is a schematic view showing the nozzle shaft with a nozzle and a filter attached of the component mounting device according to the embodiment;

FIG. 7 is a diagram for illustrating detection of the quality of the inserted state of the filter of the component mounting device according to the embodiment;

FIG. 9 is a flowchart for illustrating a filter inserted state detection process at the time of filter replacement in the component mounting device according to the embodiment;

FIG. 10 is a flowchart for illustrating a filter inserted state detection process at the time of visual confirmation in the component mounting device according to the embodiment;

DETAILED DESCRIPTION

An embodiment embodying the present disclosure is hereinafter described on the basis of the drawings.

Structure of Component Mounting Device

The structure of a component mounting device 100 according to the embodiment of the present disclosure is described with reference to FIGS. 1 to 7.

Figure 1:
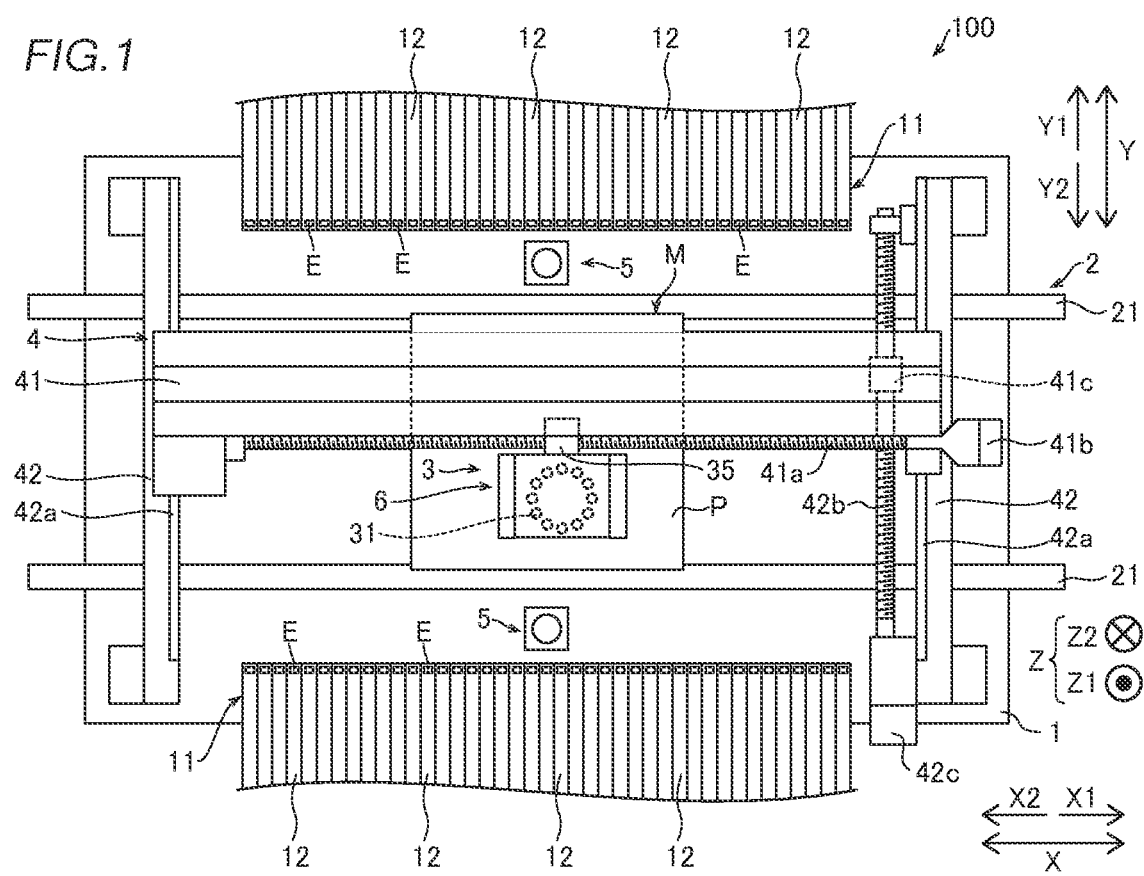
FIG. 1 is a schematic view showing the overall structure of a component mounting device according to an embodiment.

As shown in FIG. 1, the component mounting device 100 is a device that mounts components E (electronic components) such as ICs, transistors, capacitors, and resistors on a board P such as a printed circuit board.

Figure 2:
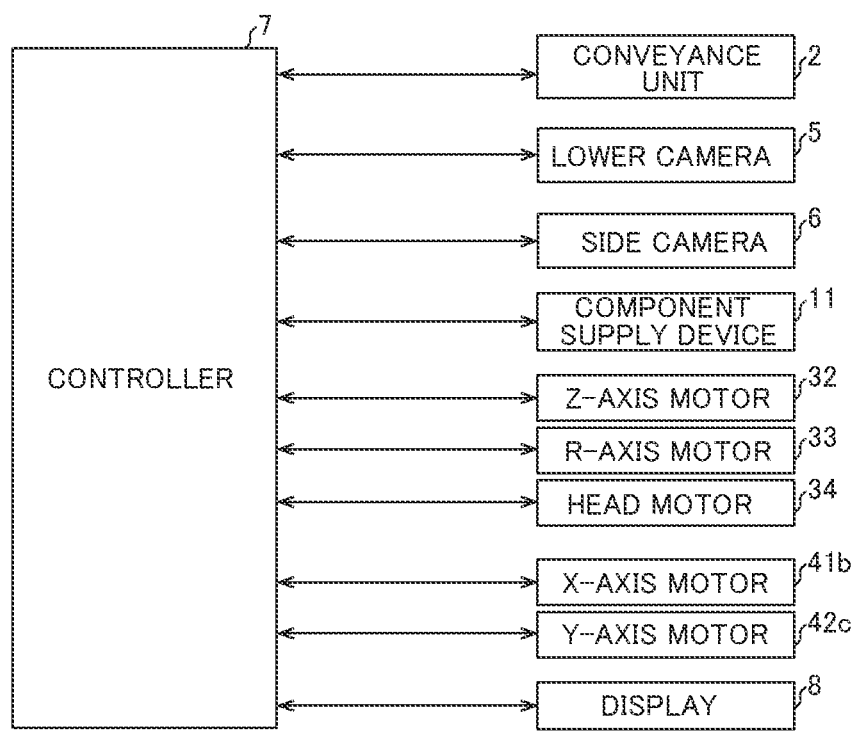
FIG. 2 is a block diagram showing the control structure of the component mounting device according to the embodiment.

As shown in FIGS. 1 and 2, the component mounting device 100 includes a base 1, a conveyance unit 2, a head unit 3, a head horizontal movement mechanism 4, lower cameras 5, a side camera 6, a controller 7 (see FIG. 2), and a display 8 (see FIG. 2).

The base 1 is a base on which each component is arranged in the component mounting device 100. On the base 1, the conveyance unit 2, a rail 42 of the head horizontal movement mechanism 4, which is described below, and the lower cameras 5 are provided. The controller 7 is provided in the base 1. Furthermore, on the base 1, component supply devices 11 are arranged on opposite sides (a Y1 direction side and a Y2 direction side) in a Y direction, respectively.

The component supply devices 11 are devices that supply the components E to be mounted on the board P. The component supply devices 11 each include tape feeders 12, for example. The tape feeders 12 hold reels (not shown) on which component supply tapes (not shown) that hold a plurality of components E are wound. The tape feeders 12 are configured to supply the components E by rotating the held reels to feed the component supply tapes in response to the component suction operation of the head unit 3 to take out the components E. In the base 1, a plurality of tape feeders 12 are arranged side by side in an X direction on the opposite sides in the Y direction. The component supply devices 11 may include tray feeders that supply the components E by trays that hold the components E.

The conveyance unit 2 is configured to carry in the board P before mounting, convey the board P in a board conveyance direction (X direction), and carry out the board P after mounting. The conveyance unit 2 is configured to convey the carried-in board P to a mounting operation position M and fix the board P at the mounting operation position M by a board fixing mechanism (not shown). The conveyance unit 2 includes a pair of conveyance belts 21, and conveys the board P in the board conveyance direction while supporting both ends of the board P in the Y direction from below (Z2 direction side) by the pair of conveyance belts 21.

The head unit 3 is a rotary head unit for component mounting. The head unit 3 mounts the components E on the board P fixed at the mounting operation position M. The head unit 3 includes a plurality of (twelve) heads 31 (mounting heads) to suction and mount the components E. The plurality of heads 31 are annularly arranged at equal angular intervals. The detailed structure of the heads 31 is described below.

The head unit 3 includes a Z-axis motor 32 (see FIG. 2) to move each head 31 in an upward-downward direction (Z direction), an R-axis motor 33 (see FIG. 2) to rotate each head 31 about a rotation axis that extends in the Z direction, and a head motor 34 to rotate the plurality of heads 31 about a rotation axis A (see FIG. 3) that extends in the Z direction. The heads 31 are movable in the upward-downward direction between lowered positions for suctioning the components E or mounting the suctioned components E and raised positions for conveying the suctioned components E to the board P with the Z-axis motor 32. Furthermore, the heads 31 can adjust the orientations of the suctioned components E by being rotated by the R-axis motor 33 while suctioning the components E. The plurality of heads 31 are rotated about the rotation axis A by the head motor 34 while maintaining an annularly arranged state.

The head horizontal movement mechanism 4 is configured to move the head unit 3 in a horizontal direction (the X direction and the Y direction). The head horizontal movement mechanism 4 includes a support 41 to support the head unit 3 such that the head unit 3 is movable in the board conveyance direction (X direction), and the rail 42 to support the support 41 such that the support 41 is movable in the Y direction. The support 41 includes a ball screw shaft 41a that extends in the board conveyance direction and an X-axis motor 41b to rotate the ball screw shaft 41a. On the head unit 3, a ball nut 35 that engages with the ball screw shaft 41a of the support 41 is provided. The ball screw shaft 41a is rotated by the X-axis motor 41b such that the head unit 3 is movable in the board conveyance direction along the support 41 together with the ball nut 35 that engages with the ball screw shaft 41a.

The rail 42 includes a pair of guide rails 42a to support both ends of the support 41 in the X direction such that the support 41 is movable in the Y direction, a ball screw shaft 42b that extends in the Y direction, and a Y-axis motor 42c to rotate the ball screw shaft 42b. On the support 41, a ball nut 41c that engages with the ball screw shaft 42b of the rail 42 is provided. The ball screw shaft 42b is rotated by the Y-axis motor 42c such that the support 41 is movable in the Y direction along the pair of guide rails 42a of the rail 42 together with the ball nut 41c that engages with the ball screw shaft 42b.

The head unit 3 is movable in the horizontal direction above the base 1 by the support 41 and the rail 42 of the head horizontal movement mechanism 4. Thus, the head unit 3 can move above the component supply devices 11 and suction and hold the components E supplied from the component supply devices 11. Furthermore, the head unit 3 can move above the fixed board P at the mounting operation position M and mount the held (suctioned) components E on the board P.

The lower cameras 5 are cameras for component recognition. The lower cameras 5 are configured to image the components E suctioned by nozzles 312 (see FIG. 3) of the heads 31, which are described below, prior to component E mounting. The lower cameras 5 are fixed on the upper surface of the base 1, and are configured to image the components E suctioned by the nozzles 312 of the heads 31 from below (Z2 direction side). Based on the component E imaging results of the lower cameras 5, the controller 7 acquires (recognizes) the held states (rotating postures and held positions with respect to the heads 31) of the components E.

The side camera 6 (side view camera) is configured to image the nozzles 312 of the heads 31 and the components E suctioned by the nozzles 312 of the heads 31 from the side (horizontal direction) prior to component E mounting. Based on the component E imaging results of the side camera 6, the controller 7 is configured to recognize the actual thicknesses of the components E viewed from the side and correct variations in the thicknesses of the components E due to the tolerance. Furthermore, the side camera 6 is provided on the head unit 3. The side camera 6 is movable in the horizontal direction above the base 1 together with the head unit 3.

As shown in FIG. 3, the side camera 6 includes a light irradiator 61 to emit light when the components E, which are subjects to be imaged, are imaged, and an imager 62 to image the components E, which are subjects to be imaged. The imager 62 is an example of a "light detector" in the claims.

The light irradiator 61 includes a light source 611 and a diffuser 612. The light source 611 includes a light-emitting diode (LED), for example, and can emit light. The diffuser 612 is configured to diffuse the light from the light source 611. Specifically, the diffuser 612 is formed by distributing a particulate diffusing material into a translucent resin material such as an acrylic resin. The light irradiator 61 irradiates the heads 31 (heads 31 on the X1 direction side) that have suctioned the components E to be imaged with light from the side (X2 direction side) by the light source 611 and the diffuser 612.

The imager 62 includes a semiconductor imaging device such as a CCD image sensor or a CMOS image sensor, and is configured to image the heads 31 that have suctioned the components E to be imaged from the side (X1 direction side, a direction orthogonal to the axial directions of the heads 31). Furthermore, the imager 62 is configured to transmit the imaging results to the controller 7.

As shown in FIG. 2, the controller 7 is a control circuit that controls the operation of the component mounting device 100. The controller 7 includes a central processing unit (CPU), a read-only memory (ROM), and a random access memory (RAM). The controller 7 performs a control to cause the head unit 3 to mount the components E on the board P by controlling the conveyance unit 2, the component supply devices 11, the X-axis motor 41*b*, and the Y-axis motor 42*c*, for example, according to production programs. The display 8 includes a liquid crystal monitor, for example, and is configured to display information to be announced to a user such as an operator.

Structure of Head

The structure of the heads 31 is now described with reference to FIGS. 3 to 6A and 6B. In FIGS. 3 to 6A and 6B, an axially orthogonal direction (horizontal direction) orthogonal to the axial directions (Z direction) of the heads 31 is shown as an A direction. Furthermore, one direction in the A direction is shown as an A1 direction, and the other direction in the A direction is shown as an A2 direction.

As shown in FIGS. 3 and 4A and 4B, the heads 31 each include a nozzle shaft 311 that is a main body of the head 31 that extends in the upward-downward direction (Z direction), and a nozzle 312 configured to be attachable to and detachable from the nozzle shaft 311. In FIG. 3, the head 31 is shown in a simplified form. In FIGS. 4A and 4B, only the tip end 311*a* of the nozzle shaft 311 on the nozzle 312 side (Z2 direction side) is shown for the nozzle shaft 311.

Figure 5:
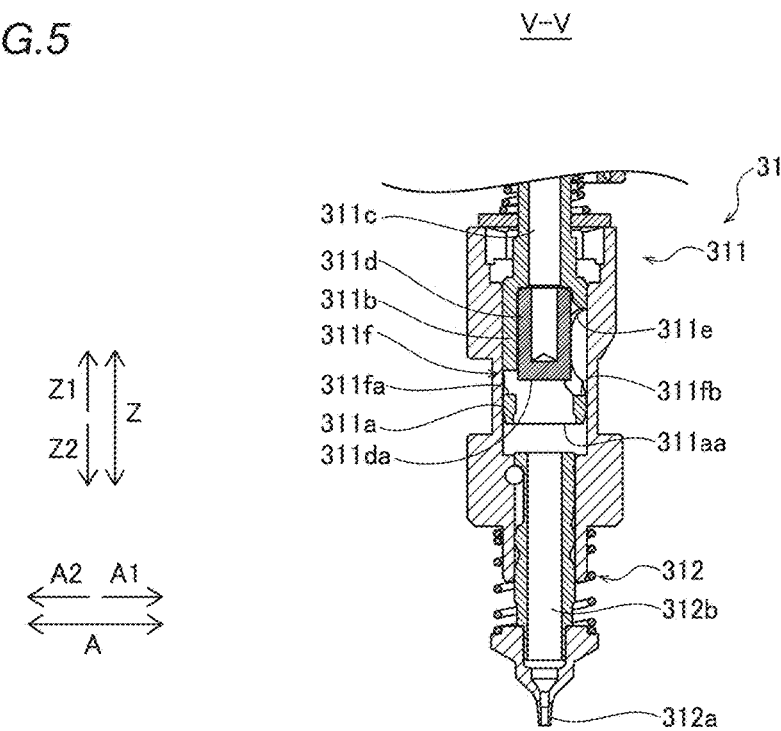
FIG. 5 is a schematic sectional view taken along the V-V line in FIG. 4B.

As shown in FIGS. 4A, 4B, and FIG. 5, the nozzle 312 has the tip end 312*a* and is configured to suction the component E to the tip end 312*a*. Furthermore, the nozzle 312 has a fluid passage 312*b* (see FIG. 5) therein, and a negative pressure or positive pressure is supplied from a pressure source (not shown) such as a pump through the fluid passage 312*b*. The nozzle 312 is configured to suction the component E to the tip end 312*a* by the negative pressure supplied through the fluid passage 312*b*. Furthermore, the nozzle 312 is configured to press the component E suctioned to the tip end 312*a* against the mounting position on the board P by the positive pressure supplied through the fluid passage 312*b* and arrange the component E.

The nozzle shaft 311 has the tip end 311*a* that is an end on the nozzle 312 side (Z2 direction side). The nozzle 312 is configured to be attachable to and detachable from the tip end 311*a*. The nozzle shaft 311 has a hollow tubular shape, and a fluid (air) for negative pressure or positive pressure supply can flow through the nozzle shaft. Specifically, the nozzle shaft 311 has a side wall 311*b* that is a wall portion of a cylinder extending in the upward-downward direction (Z direction) and a fluid passage 311*c* that is a hollow portion of the cylinder provided in the side wall 311*b*. The fluid passage 311*c* is a passage through which a fluid (air) for negative pressure or positive pressure supply flows. The fluid passage 311*c* is fluidly connected to the fluid passage 312*b* of the nozzle 312.

The nozzle shaft 311 includes a dust collecting filter 311*d* configured to be attachable to and detachable from the fluid passage 311*c*. The filter 311*d* is replaced when the degree of dirt becomes severe, for example. The filter 311*d* is inserted into the fluid passage 311*c* along the axial direction (Z direction) of the nozzle shaft 311. Thus, the filter 311*d* is attached to the fluid passage 311*c*. The nozzle shaft 311 has an opening 311*aa* for inserting the filter 311*d* on the end surface of the tip end 311*a* on the Z2 direction side. The opening 311*aa* is connected to the fluid passage 311*c*. The filter 311*d* can be made of a sponge, for example.

The flow of the fluid (air) at the time of suction (at the time of negative pressure supply) in the fluid passage 312*b* of the nozzle 312 and the fluid passage 311*c* of the nozzle shaft 311 via the filter 311*d* is described with reference to FIG. 6A.

Figure 6A:
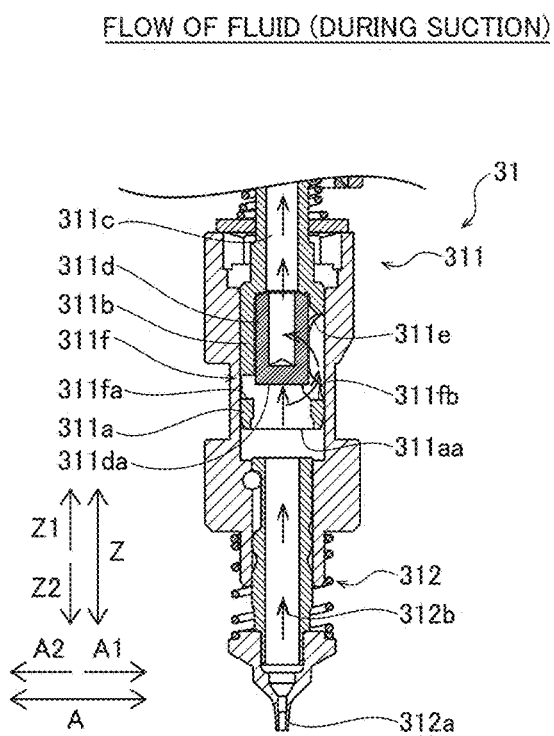
FIG. 6A is a schematic sectional view showing the flow of a fluid at the time of suction in the nozzle and the nozzle shaft of the component mounting device according to the embodiment.

As shown in FIG. 6A, the fluid flows into the fluid passage 312*b* of the nozzle 312 in a Z1 direction through an opening of the tip end 312*a* of the nozzle 312. Then, the fluid flows through the fluid passage 312*b* of the nozzle 312 in the Z1 direction and flows into the fluid passage 311*c* of the nozzle shaft 311 in the Z1 direction. Then, the fluid flows in the Z1 direction through the filter 311*d* arranged in the fluid passage 311*c*. At this time, the filter 311*d* removes components to be removed (such as dust) in the fluid. Then, the fluid further flows through the fluid passage 311*c* in the Z1 direction and reaches the pressure source such as a pump. Although detailed description is omitted, the fluid flows in a direction opposite to that at the time of negative pressure supply when the positive pressure is supplied.

The nozzle shaft 311 has a fluid passage opening 311*e* in the side wall 311*b* on the A1 direction side such that the fluid passage opening 311*e* faces the side surface of the filter 311*d* in the A direction. The fluid passage opening 311*e* is an opening that allows the fluid (air) for negative pressure or positive pressure supply to flow to the side surface of the filter 311*d* on the A1 direction side during suction (negative pressure supply) or during positive pressure supply. Thus, the fluid is allowed to flow into the filter 311*d* not only from the end surface of the filter 311*d* on the Z2 direction side but also from the side surface of the filter 311*d* on the A1 direction side, and thus the dust collection effect of the filter 311*d* can be enhanced.

Figure 6B:
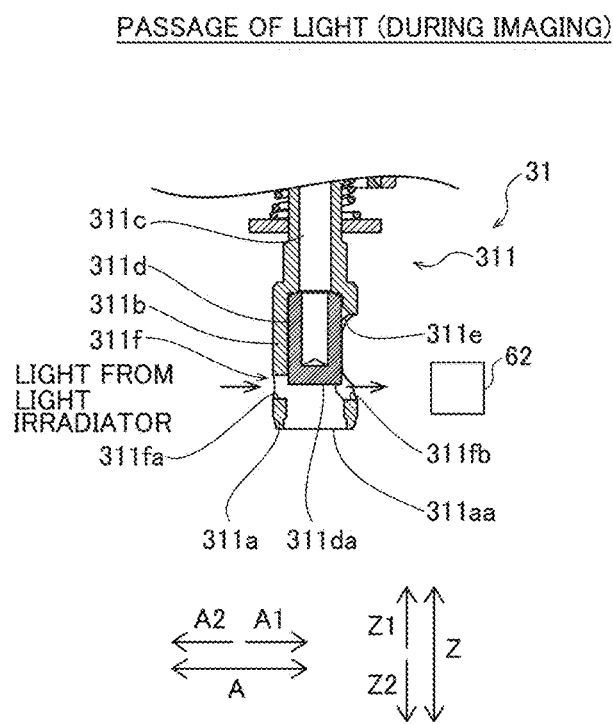
FIG. 6B is a schematic sectional view showing the passage of light during imaging in a filter state checking portion of the nozzle shaft of the component mounting device according to the embodiment.

In this embodiment, as shown in FIGS. 4A, 4B, 5, 6B, and 7, the nozzle shaft 311 includes a filter state checking portion 311*f* to check the inserted state of the filter 311*d* in the fluid passage 311*c* of the nozzle shaft 311. The filter state checking portion 311*f* is provided in the side wall 311*b* so as to face the end 311*da* (the end on the side (Z2 direction side) opposite to the insertion side, the lower end) of the properly attached filter 311*d* in the A direction. Furthermore, the filter state checking portion 311*f* is configured to allow light to pass therethrough from a first side to a second side of the nozzle shaft 311 in the A direction according to the inserted state (attached state) of the filter 311*d*. That is, the filter state checking portion 311*f* is configured to allow light corresponding to the inserted state of the filter 311*d* to pass through the nozzle shaft 311 in the A direction. In FIGS. 4B, 5, and 6B, the properly attached filter 311*d* is shown.

The filter state checking portion 311*f* includes a hole that allows light to pass therethrough from the first side to the second side of the nozzle shaft 311 in the A direction. That is, the filter state checking portion 311*f* includes a hole that allows light to pass through the nozzle shaft 311 in the A direction. The hole of the filter state checking portion 311*f* includes two through-holes 311*fa* and 311*fb* that face each other in the A direction with the filter 311*d* interposed therebetween. The through-hole 311*fa* is provided in the side wall 311*b* of the nozzle shaft 311 on the A2 direction side. The through-hole 311*fa* has a substantially circular shape. The through-hole 311*fb* is provided in the side wall 311*b* of the nozzle shaft 311 on the A1 direction side. The through-hole 311*fb* is provided so as to be continuous with the fluid passage opening 311*e*. The through-hole 311*fb* continuous with the fluid passage opening 311*e* has a substantially semicircular shape so as to cut out the fluid passage opening 311*e*.

In this embodiment, as shown in FIG. 6B, when the inserted state of the filter 311*d* is checked, the light irradiator 61 of the side camera 6 is arranged on the A2 direction side with respect to the nozzle shaft 311, and the imager 62 of the side camera 6 is arranged on the A1 direction side with respect to the nozzle shaft 311. At this time, the nozzle shaft 311 is arranged such that the through-hole 311*fa* of the filter state checking portion 311*f* faces the light irradiator 61 (A2 direction side) of the side camera 6, and the through-hole 311*fb* of the filter state checking portion 311*f* faces the imager 62 (A1 direction side) of the side camera 6. When the inserted state of the filter 311*d* is checked, the nozzle 312 is removed from the nozzle shaft 311.

The light irradiator 61 of the side camera 6 irradiates the through-hole 311*fa* of the filter state checking portion 311*f* with light from the A2 direction side with respect to the nozzle shaft 311 when the filter state checking portion 311*f* is imaged by the imager 62 of the side camera 6. The light emitted by the light irradiator 61 of the side camera 6 passes through the filter state checking portion 311*f* in the order of the through-hole 311*fa* and the through-hole 311*fb*. The imager 62 of the side camera 6 detects the light emitted by the light irradiator 61 of the side camera 6 and having passed through the through-holes 311*fa* and 311*fb* of the filter state checking portion 311*f*. That is, the imager 62 of the side camera 6 images the filter state checking portion 311*f* from the A1 direction side.

Configuration for Detecting Quality of Inserted State of Filter

Figure 7:
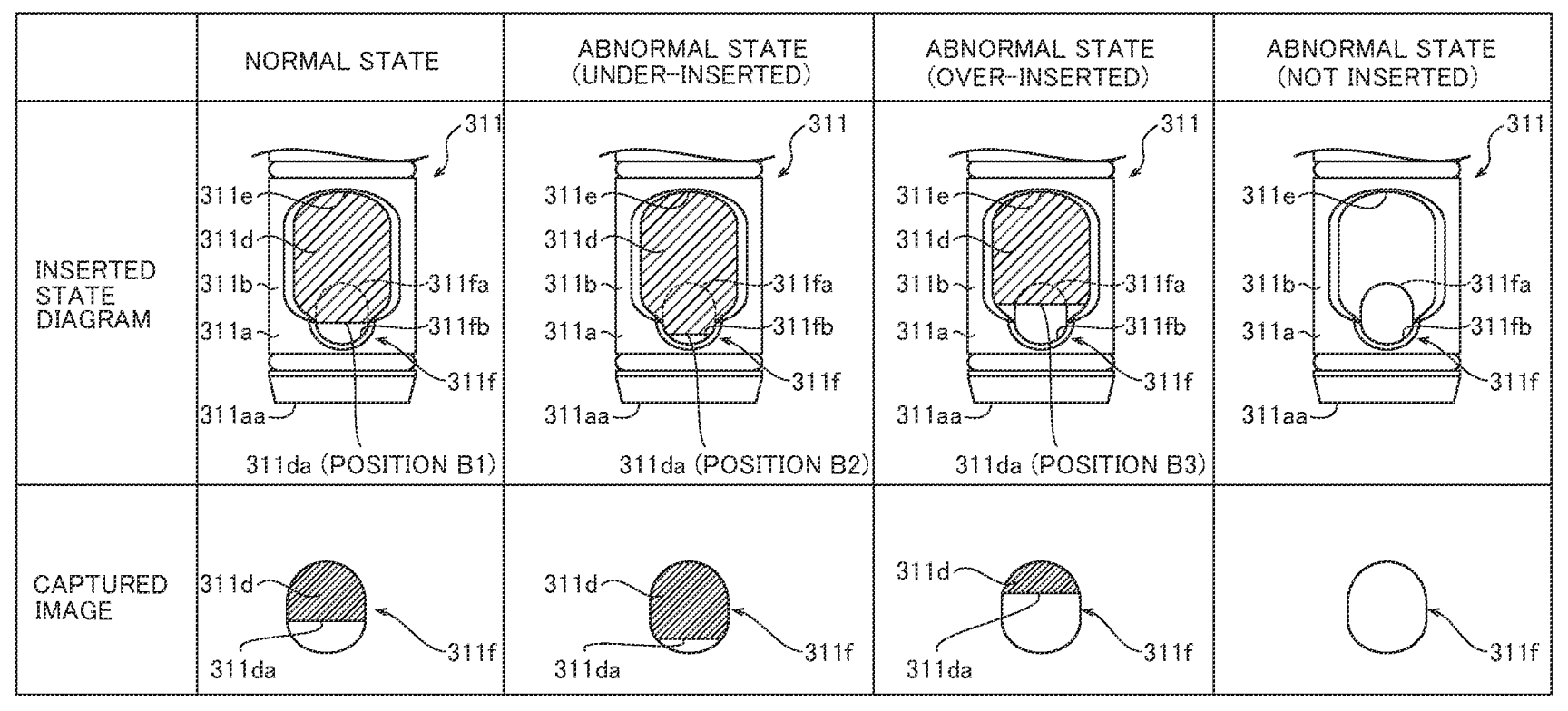

As shown in FIG. 7, the position of the end 311*da* of the filter 311*d* facing the filter state checking portion 311*f* in the A direction changes in the Z direction according to the inserted state of the filter 311*d*, and thus the passing state of light in the filter state checking portion 311*f* changes. That is, the shielded state of the light passing through the filter state checking portion 311*f* by the filter 311*d* changes. In FIG. 7, the filter 311*d* is shown by hatching for ease of understanding.

When the filter 311*d* is properly attached, the end 311*da* of the filter 311*d* is located at a design position B1. The design position B1 is the position of the filter state checking portion 311*f* between one end and the other end in a direction (Z direction) along the insertion direction of the filter 311*d*. The design position B1 is preferably a position in the vicinity of an intermediate position between one end and the other end. In this state, a portion of the light that intends to pass through the filter state checking portion 311*f* is shielded by the filter 311*d*, and the remaining portion of the light that intends to pass through the filter state checking portion 311*f* passes without being shielded by the filter 311*d*.

For example, when an insertion force is weak and the filter 311*d* is attached while being under-inserted, the end 311*da* of the filter 311*d* is located at a position B2 on the Z2 direction side with respect to the design position B1. In this state, the degree of overlapping between the end 311*da* of the filter 311*d* and the filter state checking portion 311*f* is larger than that when the filter 311*d* is properly attached. Therefore, in this state, the degree of shielding of the light that intends to pass through the filter state checking portion 311*f* by the filter 311*d* is larger than that when the filter 311*d* is properly attached, and the passing degree of light in the filter state checking portion 311*f* becomes small.

For example, when an insertion force is strong and the filter 311*d* is attached while being over-inserted, the end 311*da* of the filter 311*d* is located at a position B3 on the Z1 direction side with respect to the design position B1. In this state, the degree of overlapping between the end 311*da* of the filter 311*d* and the filter state checking portion 311*f* is smaller than that when the filter 311*d* is properly attached. Therefore, in this state, the degree of shielding of the light that intends to pass through the filter state checking portion 311*f* by the filter 311*d* is smaller than that when the filter 311*d* is properly attached, and the passing degree of light in the filter state checking portion 311*f* becomes large.

For example, when the user forgets to insert the filter 311*d* and the filter 311*d* is not inserted, the filter 311*d*, which is a light shield, is not provided, and thus the passing degree of light in the filter state checking portion 311*f* is maximized.

Thus, the passing state of light in the filter state checking portion 311*f* changes according to the inserted state of the filter 311*d*, and thus the passing state of light in the filter state checking portion 311*f* is checked such that the quality of the inserted state of the filter 311*d* can be checked.

Therefore, in this embodiment, the controller 7 performs a control to detect the quality of the inserted state of the filter 311*d* based on the result of detection of the light passing through the filter state checking portion 311*f* by the imager 62 of the side camera 6. That is, the controller 7 performs a control to detect the quality of the inserted state of the filter 311*d* based on the result of imaging of the filter state checking portion 311*f* by the imager 62 of the side camera 6.

Specifically, the controller 7 performs a control to detect, as the quality of the inserted state of the filter 311*d*, that the inserted state of the filter 311*d* is a normal state, that the inserted state of the filter 311*d* is an over-inserted state, that the inserted state of the filter 311*d* is an under-inserted state, and that the inserted state of the filter 311*d* is a non-inserted state.

The detection of the quality of the inserted state of the filter 311*d* based on the imaging result is not particularly limited, but can be performed based on the area of a bright portion corresponding to the filter state checking portion 311*f* in a captured image that is the imaging result, for example. In this case, the controller 7 acquires the area of the bright portion corresponding to the filter state checking portion 311*f* in the captured image that is the imaging result based on the imaging result of the filter state checking portion 311*f*, for example. Then, the controller 7 performs a control to detect the quality of the inserted state of the filter 311*d* based on the acquired area of the bright portion.

Specifically, the controller 7 detects that the inserted state of the filter 311*d* is a normal state when the acquired area of the bright portion is within a predetermined first threshold range. The controller 7 detects that the inserted state of the filter 311*d* is an under-inserted state when the acquired area of the bright portion is equal to or less than a lower limit of the predetermined first threshold range. The controller 7 detects that the inserted state of the filter 311*d* is an over-inserted state when the acquired area of the bright portion is equal to or greater than an upper limit of the predetermined first threshold range and equal to or less than a lower limit of a predetermined second threshold range. The controller 7 detects that the inserted state of the filter 311*d* is a non-inserted state when the acquired area of the bright portion is equal to or greater than an upper limit of the predetermined second threshold range.

For example, the quality of the inserted state of the filter 311*d* based on the imaging result can be detected based on the position of the end 311*da* of the filter 311*d* in the captured image that is the imaging result. In this case, the controller 7 acquires the position of the end 311*da* of the filter 311*d* in the captured image that is the imaging result based on the imaging result of the filter state checking portion 311*f*, for example. Then, the controller 7 performs a control to detect the quality of the inserted state of the filter 311*d* based on the acquired position of the end 311*da* of the filter 311*d*.

Specifically, the controller 7 detects that the inserted state of the filter 311*d* is a normal state when the acquired position of the end 311*da* of the filter 311*d* is within a predetermined position range. The controller 7 detects that the inserted state of the filter 311*d* is an under-inserted state when the acquired position of the end 311*da* of the filter 311*d* is outside the lower limit position of the predetermined position range. The controller 7 detects that the inserted state of the filter 311*d* is an over-inserted state when the acquired position of the end 311*da* of the filter 311*d* is outside the upper limit position of the predetermined position range. The controller 7 detects that the inserted state of the filter 311*d* is a non-inserted state when the position of the end 311*da* of the filter 311*d* cannot be acquired.

Configuration for Notification of Detection Result

The controller 7 performs a control to notify the user that the inserted state of the filter 311*d* is an abnormal state when it is detected that the inserted state of the filter 311*d* is an abnormal state. For example, the controller 7 performs a control to notify the user that the inserted state of the filter 311*d* is an abnormal state by displaying information on the display 8 or displaying information on a display of a mobile terminal carried by the user.

Configuration for Detection Timing

The controller 7 performs a control to detect the quality of the inserted state of the filter 311*d* at the time of production start of the board P (when the component mounting device 100 is started). That is, the controller 7 performs a control to detect the quality of the inserted state of the filter 311*d* before the board P is carried into the component mounting device 100. At this time, the controller 7 performs a control to detect the quality of the inserted states of all the filters 311*d* of a plurality of (twelve) nozzle shafts 311.

The controller 7 performs a control to detect the quality of the inserted state of the filter 311*d* even when the filter 311*d* is replaced. At this time, the controller 7 performs a control to detect the quality of the inserted state of the filter 311*d* of the nozzle shaft 311 in which the filter 311*d* has been replaced among the plurality of nozzle shafts 311.

The controller 7 controls the light irradiator 61 of the side camera 6 to irradiate the filter state checking portion 311*f* with light when the operator checks the quality of the inserted state of the filter 311*d*. Thus, the passing state of light in the filter state checking portion 311*f* can be easily checked even at the time of visual confirmation by the operator.

Filter Inserted State Detection Process at Time of Production Start

Figure 8:
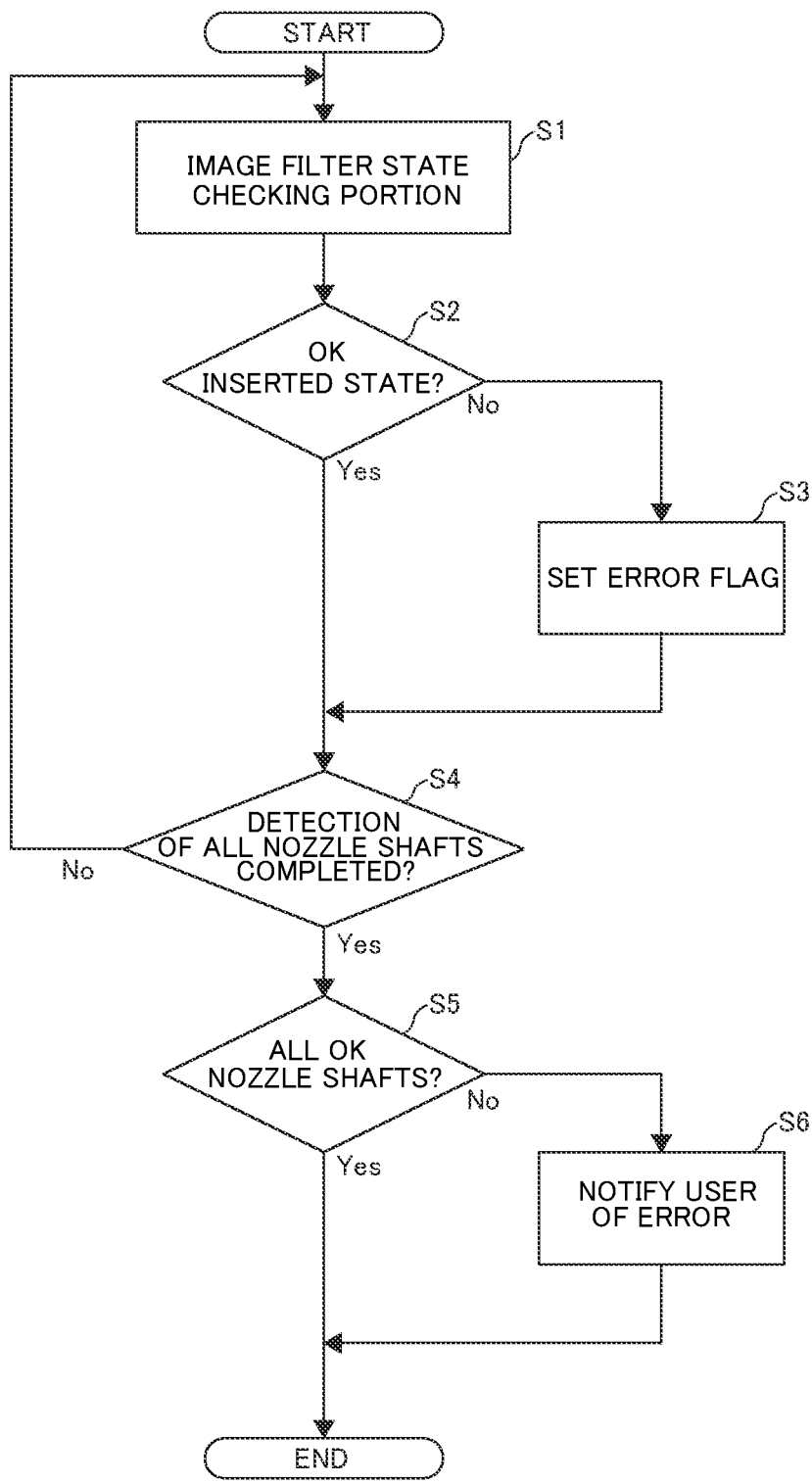
FIG. 8 is a flowchart for illustrating a filter inserted state detection process at the time of production start in the component mounting device according to the embodiment.

A filter inserted state detection process at the time of production start in the component mounting device 100 according to this embodiment is now described based on a flowchart with reference to FIG. 8. Each process operation of the flowchart is performed by the controller 7. Furthermore, the time of production start is the time at which a start button for production start is pressed, for example.

As shown in FIG. 8, when the start button for production start is pressed to start production, for example, first, in step S1, the side camera 6 images the filter state checking portion 311*f*. In step S1, the light irradiator 61 of the side camera 6 irradiates the filter state checking portion 311*f* with light. Furthermore, in step S1, the imager 62 of the side camera 6 images the filter state checking portion 311*f*.

Then, in step S2, it is determined whether or not the inserted state of the filter 311*d* is a normal state based on the result of imaging of the filter state checking portion 311*f*. When it is determined in step S2 that the inserted state of the filter 311*d* is a normal state, the process advances to step S4. When it is determined in step S2 that the inserted state of the filter 311*d* is not a normal state (abnormal state), the process advances to step S3. In step S2, the type of abnormal state (i.e., under-insertion, over-insertion, non-insertion, etc.) may be detected, or only the abnormal state may be detected.

Then, in step S3, an error flag is set. In step S3, when the type of abnormal state is detected, the error flag is set according to the type of abnormal state. The error flag to be set can be "1" when the abnormal state is that the inserted state of the filter 311*d* is an under-inserted state, "2" when the abnormal state is that the inserted state of the filter 311*d* is an over-inserted state, and "3" when the abnormal state is that the inserted state of the filter 311*d* is a non-inserted state, for example. Furthermore, in step S3, when the type of abnormal state is not detected, an error flag simply indicating that the inserted state is abnormal is set. The error flag to be set can be "1", for example.

Then, in step S4, it is determined whether or not the quality of the inserted states of all the filters 311*d* of the plurality of (twelve) nozzle shafts 311 has been detected. When it is determined in step S4 that the quality of the inserted states of all the filters 311*d* of the plurality of nozzle shafts 311 has not been detected, the process returns to step S1. Then, the quality of the inserted state of the filter 311*d* of the next nozzle shaft 311 is detected. When it is determined in step S4 that the quality of the inserted states of all the filters 311*d* of the plurality of nozzle shafts 311 has been detected, the process advances to step S5.

Then, in step S5, it is determined whether or not it has been detected that the inserted states of all the filters 311*d* of the plurality of nozzle shafts 311 are normal states. When it is determined in step S5 that it has been detected that the inserted states of all the filters 311*d* of the plurality of nozzle shafts 311 are normal states, the filter inserted state detection process is terminated. When it is determined in step S5 that it has not been detected that the inserted states of all the filters 311*d* of the plurality of nozzle shafts 311 are normal states, the process advances to step S6.

Then, in step S6, the user such as an operator is notified of an error. In step S6, the user is notified that the inserted state of the filter 311*d* is an abnormal state. In step S6, the user is notified of the nozzle shaft 311 in which the abnormal state has been detected, the type of abnormal state, etc., for example. Then, the filter inserted state detection process is terminated. In the abnormal case (when the filter inserted state detection process is terminated via step S6), the production of the board P is not started. On the other hand, in the normal case (when the filter inserted state detection process is terminated without going through step S6), the production of the board P is started.

Filter Inserted State Detection Process at Time of Filter Replacement

A filter inserted state detection process at the time of filter replacement in the component mounting device 100 according to this embodiment is now described based on a flowchart with reference to FIG. 9. Each process operation of the flowchart is performed by the controller 7. The process of this flowchart is executed at the end of automatic replacement when the filter 311d is automatically replaced by a change in a negative pressure, for example. Furthermore, the process of this flowchart may be executed when a button for starting the filter inserted state detection process is prepared and the button is pressed, for example.

As shown in FIG. 9, when the filter 311d is replaced, first, in step S11, the side camera 6 images the filter state checking portion 311f of the nozzle shaft 311 in which the filter 311d has been replaced. In step S11, the light irradiator 61 of the side camera 6 irradiates the filter state checking portion 311f with light. Furthermore, in step S11, the imager 62 of the side camera 6 images the filter state checking portion 311f.

Then, in step S12, it is determined whether or not the inserted state of the filter 311d is a normal state based on the result of imaging of the filter state checking portion 311f. In step S12, the type of abnormal state (i.e., under-insertion, over-insertion, non-insertion, etc.) may be detected, or only the abnormal state may be detected. When it is determined in step S12 that the inserted state of the filter 311d is not a normal state (abnormal state), the process advances to step S13.

Then, in step S13, the user such as an operator is notified of an error. In step S13, the user is notified that the inserted state of the filter 311d is an abnormal state. In step S13, the user is notified of the nozzle shaft 311 in which the abnormal state has been detected, the type of abnormal state, etc., for example. Then, the filter inserted state detection process is terminated.

When it is determined in step S12 that the inserted state of the filter 311d is a normal state, the process advances to step S14.

Then, in step S14, it is determined whether or not it has been detected that the inserted states of all the filters 311d of the plurality of nozzle shafts 311 are normal states. When it is determined in step S14 that it has not been detected that the inserted states of all the filters 311d of the plurality of nozzle shafts 311 are normal states, the process returns to step S11. Then, the quality of the inserted state of the filter 311d of the next nozzle shaft 311 is detected. When it is determined in step S14 that it has been detected that the inserted states of all the filters 311d of the plurality of nozzle shafts 311 are normal states, the filter inserted state detection process is terminated.

Filter Inserted State Detection Process at Time of Visual Confirmation

A filter inserted state detection process at the time of visual confirmation in the component mounting device 100 according to this embodiment is now described based on a flowchart with reference to FIG. 10. Each process operation of the flowchart is performed by the controller 7.

As shown in FIG. 10, first, in step S21, a user's start operation of the visual confirmation of the inserted state of the filter 311d is received.

Then, in step S22, the light irradiator 61 of the side camera 6 irradiates the filter state checking portion 311f with light. The user checks the passing state of the light in the filter state checking portion 311f, and checks the quality of the inserted state of the filter 311d.

Then, in step S23, a user's end operation of the visual confirmation of the inserted state of the filter 311d is received. Then, the filter inserted state detection process is terminated.

According to this embodiment, the following advantageous effects are achieved.

According to this embodiment, as described above, the filter state checking portion 311f is provided in the side wall 311b so as to face the end 311da of the properly attached filter 311d in the axially orthogonal direction orthogonal to the axial direction of the nozzle shaft 311. Furthermore, the filter state checking portion 311f is configured to allow light to pass therethrough from the first side to the second side of the nozzle shaft 311 in the axially orthogonal direction according to the inserted state of the filter 311d. Accordingly, when the position of the end 311da of the filter 311d facing the filter state checking portion 311f in the axially orthogonal direction is changed in the axial direction according to the inserted state of the filter 311d, the passing state of light in the filter state checking portion 311f can be changed. Consequently, the passing state of light in the filter state checking portion 311f is checked such that the quality of the inserted state of the filter 311d can be checked. Thus, unlike a case in which the quality of the inserted state of the filter 311d is checked using light reflected from a surface of the filter 311d, the quality of the inserted state of the filter 311d can be checked regardless of the surface condition (dirt, color, etc.) of the filter 311d. Consequently, it is possible to provide the component mounting device 100 that enables the quality of the inserted state of the filter 311d to be accurately checked.

According to this embodiment, as described above, the filter state checking portion 311f includes a hole that allows light to pass therethrough from the first side to the second side of the nozzle shaft 311 in the axially orthogonal direction. Accordingly, the filter state checking portion 311f can be easily configured to allow light to pass therethrough from the first side to the second side of the nozzle shaft 311 in the axially orthogonal direction according to the inserted state of the filter 311d.

According to the first embodiment, as described above, the hole of the filter state checking portion 311f includes the two through-holes 311fa and 311fb that face each other in the axially orthogonal direction with the filter 311d interposed therebetween. Accordingly, the filter state checking portion 311f can be more easily configured to allow light to pass therethrough from the first side to the second side of the nozzle shaft 311 in the axially orthogonal direction according to the inserted state of the filter 311d.

According to this embodiment, as described above, the through-hole 311fb of the two through-holes 311fa and 311fb of the hole of the filter state checking portion 311f is provided so as to be continuous with the fluid passage opening 311e for suction provided in the side wall 311b. Accordingly, as compared with a case in which the through-holes 311fa and 311fb of the hole of the filter state checking portion 311f are provided as holes separate from the fluid passage opening 311e, a decrease in the strength of the nozzle shaft 311 due to the provision of the through-holes 311fa and 311fb of the hole of the filter state checking portion 311f can be significantly reduced or prevented.

According to this embodiment, as described above, the component mounting device 100 includes the light irradiator 61 configured to irradiate the filter state checking portion 311f with light from the first side of the nozzle shaft 311 in the axially orthogonal direction. Accordingly, when the passing state of light in the filter state checking portion 311f is checked, the light irradiator 61 can irradiate the filter state checking portion 311f with light from the first side of the nozzle shaft 311 in the axially orthogonal direction. Consequently, as compared with a case in which the passing state of light in the filter state checking portion 311f is checked only with natural light, the passing state of light in the filter state checking portion 311f can be checked while the amount of light for checking the inserted state of the filter 311d is increased. Thus, the quality of the inserted state of the filter 311d can be more accurately checked.

According to this embodiment, as described above, the component mounting device 100 includes the imager 62 that is a light detector configured to detect light that has been radiated by the light irradiator 61 and has passed through the filter state checking portion 311f, and the controller 7 configured to perform a control to detect the quality of the inserted state of the filter 311d based on the light detection result of the imager 62 that is a light detector. Accordingly, the controller 7 can automatically detect the quality of the inserted state of the filter 311d. Consequently, it is possible to save the operator the trouble of visually checking the quality of the inserted state of the filter 311d. This effect is particularly effective when the number of filters 311d for which the quality of the inserted state should be checked is large.

According to this embodiment, as described above, the light detector includes the imager 62 configured to image the component E suctioned by the nozzle 312 in the axially orthogonal direction. Furthermore, the controller 7 is configured to perform a control to detect the quality of the inserted state of the filter 311d based on the result of imaging of the filter state checking portion 311f by the imager 62. Accordingly, the existing imager 62 can be used as a light detector that detects the light that has passed through the filter state checking portion 311f. Consequently, it is not necessary to newly provide a light detector that detects the light that has passed through the filter state checking portion 311f. Thus, it is possible to detect the quality of the inserted state of the filter 311d while significantly reducing or preventing the complex structure of the component mounting device 100.

According to this embodiment, as described above, the controller 7 is configured to perform a control to detect, as the quality of the inserted state of the filter 311d, that the inserted state of the filter 311d is a normal state, the inserted state of the filter 311d is an over-inserted state, that the inserted state of the filter 311d is an under-inserted state, and that the inserted state of the filter 311d is a non-inserted state. Accordingly, the quality of the inserted state of the filter 311d can be detected appropriately and in detail according to the inserted state of the filter 311d.

According to this embodiment, as described above, the controller 7 is configured to perform a control to detect the quality of the inserted state of the filter 311d at the time of production start and at the time of filter 311d replacement. Thus, the controller 7 performs a control to detect the quality of the inserted state of the filter 311d at the time of production start such that the start of production can be significantly reduced or prevented when the inserted state of the filter 311d is poor. Furthermore, the controller 7 performs a control to detect the quality of the inserted state of the filter 311d when the filter 311d is replaced such that the poor inserted state of the filter 311d can be effectively detected when the filter 311d is replaced at the timing at which the inserted state of the filter 311d is likely to be poor.

MODIFIED EXAMPLES

The embodiment disclosed this time must be considered as illustrative in all points and not restrictive. The scope of the present disclosure is not shown by the above description of the embodiment but by the scope of claims for patent, and all modifications (modified examples) within the meaning and scope equivalent to the scope of claims for patent are further included.

For example, while the example in which the component mounting device includes the rotary head unit has been shown in the aforementioned embodiment, the present disclosure is not restricted to this. In the present disclosure, the component mounting device may include an in-line head unit in which a plurality of heads are linearly arranged.

Figure 11:
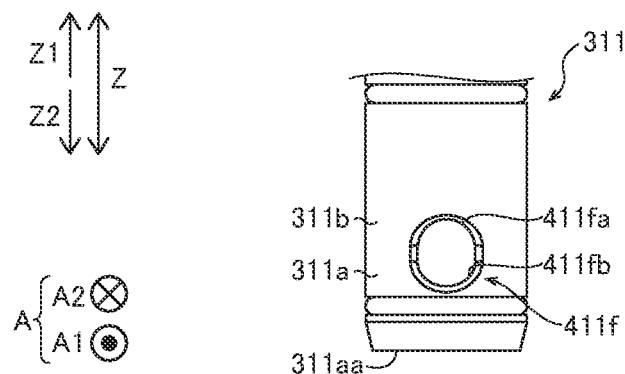
FIG. 11 is a diagram for illustrating a filter state checking portion of a nozzle shaft according to a first modified example of the embodiment.
Figure 12:
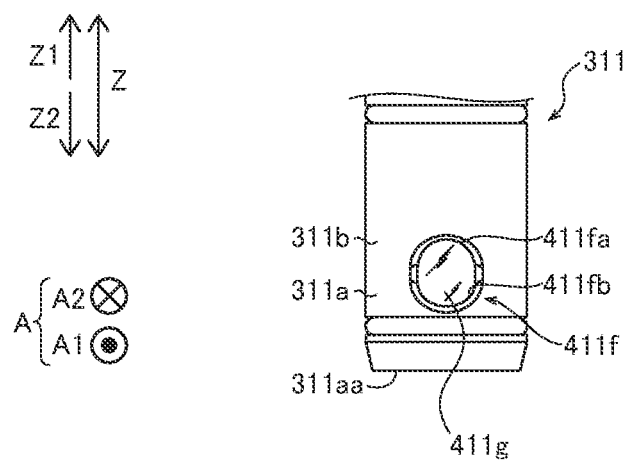
FIG. 12 is a diagram for illustrating a filter state checking portion of a nozzle shaft according to a second modified example of the embodiment.

While the example in which the nozzle shaft includes the fluid passage opening in the side wall on the A1 direction side has been shown in the aforementioned embodiment, the present disclosure is not restricted to this. In the present disclosure, the nozzle shaft does not necessarily have to include the fluid passage opening. In this case, for example, as in a first modified example shown in FIG. 11, through-holes 411fa and 411fb of a filter state checking portion 411f may be provided. Both the through-holes 411fa and 411fb of the first modified example have a substantially circular shape. Furthermore, in this case, as in a second modified example shown in FIG. 12, a transparent window 411g capable of transmitting light may be provided in the through-holes 411fa and 411fb of the filter state checking portion 411f. Even with this structure, the passing state of light in the filter state checking portion 411f is checked such that the quality of the inserted state of the filter 311d can be checked, similarly to the aforementioned embodiment.

Figure 13:
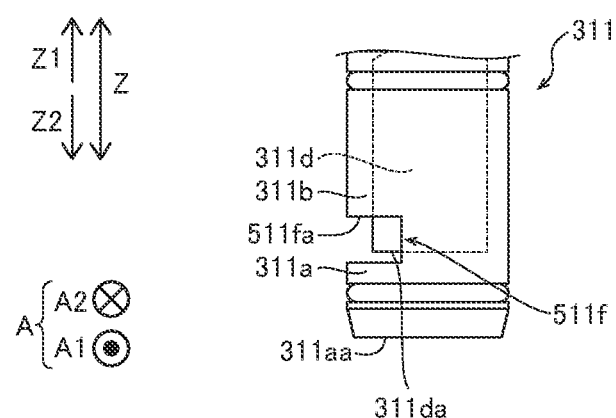
FIG. 13 is a diagram for illustrating a filter state checking portion of a nozzle shaft according to a third modified example of the embodiment.

While the example in which the filter state checking portion includes the two through-holes has been shown in the aforementioned embodiment, the present disclosure is not restricted to this. In the present disclosure, as in a third modified example shown in FIG. 13, a filter state checking portion 511f may include only one cut-out through-hole 511fa. The through hole 511fa of the filter state checking portion 511f is provided in a side wall 311b so as to face the end 311da of the properly attached filter 311d in the A direction. Furthermore, the through-hole 511fa of the filter state checking portion 511f is configured to allow light to pass therethrough from the first side to the second side of the nozzle shaft 311 in the A direction.

While the example in which the light irradiator of the side camera includes the light source unit and the diffuser has been shown in the aforementioned embodiment, the present disclosure is not restricted to this. In the present disclosure, the light irradiator of the side camera does not necessarily have to include the diffuser. In this case, for example, the light irradiator of the side camera may include the light source at the position of the diffuser of the aforementioned embodiment.

While the example in which the light irradiator of the side camera is used as the light irradiator of the present disclosure, and the imager of the side camera is used as the light detector of the present disclosure has been shown in the aforementioned embodiment, the present disclosure is not restricted to this. In the present disclosure, a dedicated light irradiator may be used as the light irradiator, and a dedicated light detector may be used as the light detector. In this case, for example, a light irradiator that radiates a laser beam may be used as the light irradiator, and a light receiving element such as a photodiode may be used as the light detector. When the light irradiator that radiates a laser beam and the light receiving element are used, the position of the end of the filter may be detected by radiating a laser beam a plurality of times or scanning the laser beam. Then, the quality of the inserted state of the filter may be detected based on the detected position of the end of the filter.

While the example in which it is detected as the quality of the inserted state of the filter that the inserted state of the filter is a normal state, that the inserted state of the filter is an over-inserted state, that the inserted state of the filter is an under-inserted state, and that the inserted state of the filter is a non-inserted state has been shown in the aforementioned embodiment, the present disclosure is not restricted to this. In the present disclosure, it may be simply detected as the quality of the inserted state of the filter that the inserted state of the filter is a normal state and that the inserted state of the filter is an abnormal state.

While the example in which the quality of the inserted state of the filter is detected at the time of production start and at the time of filter replacement has been shown in the aforementioned embodiment, the present disclosure is not restricted to this. In the present disclosure, the quality of the inserted state of the filter may be detected only at the time of production start or at the time of filter replacement. Alternatively, the quality of the inserted state of the filter may be detected at a time other than the time of production start and the time of filter replacement. For example, the quality of the inserted state of the filter may be detected based on a user's operation.

While the example in which the quality of the inserted states of all the filters of the plurality of nozzle shafts is detected when the quality of the inserted state of the filter is detected at the time of production start has been shown in the aforementioned embodiment, the present disclosure is not restricted to this. In the present disclosure, when the quality of the inserted state of the filter is detected at the time of production start, only the quality of the inserted states of some of the filters of the plurality of nozzle shafts may be detected.

While the example in which the quality of the inserted state of the filter of the nozzle shaft in which the filter has been replaced is detected among the plurality of nozzle shafts when the quality of the inserted state of the filter is detected at the time of filter replacement has been shown in the aforementioned embodiment, the present disclosure is not restricted to this. In the present disclosure, when the quality of the inserted state of the filter is detected at the time of filter replacement, the quality of the inserted state of all the filters of the plurality of nozzle shafts may be detected.

While the process operations of the controller are described, using the flowcharts described in a manner driven by a flow in which processes are performed in order along a process flow for the convenience of illustration in the aforementioned embodiment, the present disclosure is not restricted to this. In the present disclosure, the process operations of the controller may be performed in an event-driven manner in which processes are performed on an event basis. In this case, the process operations may be performed in a complete event-driven manner or in a combination of an event-driven manner and a manner driven by a flow.

What is claimed is:

1. A component mounting device comprising:
   a nozzle shaft; and
   a nozzle configured to attach to and detach from the nozzle shaft, the nozzle being configured to suction a component; wherein
   the nozzle shaft includes:
      a side wall;
      a fluid passage provided inside the side wall;
      a filter inserted into the fluid passage along an axial direction of the nozzle shaft, the filter being configured to attach to and detach from the fluid passage; and
      a filter state checking portion provided in the side wall so as to face an end of the filter in a properly attached state in an axially orthogonal direction orthogonal to the axial direction of the nozzle shaft; and
      the filter state checking portion is configured to allow light to pass therethrough from a first side to a second side of the nozzle shaft in the axially orthogonal direction according to an inserted state of the filter.

2. The component mounting device according to claim 1, wherein the filter state checking portion includes a hole that is configured to allow light to pass therethrough from the first side to the second side of the nozzle shaft in the axially orthogonal direction.

3. The component mounting device according to claim 2, wherein the hole of the filter state checking portion includes two through-holes that face each other in the axially orthogonal direction with the filter interposed therebetween.

4. The component mounting device according to claim 3, wherein at least one of the two through-holes of the hole of the filter state checking portion is provided so as to be continuous with a fluid passage opening for suction provided in the side wall.

5. The component mounting device according to claim 4, further comprising:
   a light irradiator configured to irradiate the filter state checking portion with light from the first side of the nozzle shaft in the axially orthogonal direction.

6. The component mounting device according to claim 5, further comprising:
   a light detector configured to detect light that has been radiated by the light irradiator and has passed through the filter state checking portion; and
   a controller configured to perform a control to detect quality of the inserted state of the filter based on a light detection result of the light detector.

7. The component mounting device according to claim 3, further comprising:
   a light irradiator configured to irradiate the filter state checking portion with light from the first side of the nozzle shaft in the axially orthogonal direction.

8. The component mounting device according to claim 7, further comprising:
   a light detector configured to detect light that has been radiated by the light irradiator and has passed through the filter state checking portion; and
   a controller configured to perform a control to detect quality of the inserted state of the filter based on a light detection result of the light detector.

9. The component mounting device according to claim 8, wherein
   the light detector includes an imager configured to image the component suctioned by the nozzle in the axially orthogonal direction; and
   the controller is configured to perform a control to detect the quality of the inserted state of the filter based on a result of imaging of the filter state checking portion by the imager.

10. The component mounting device according to claim 2, further comprising:
   a light irradiator configured to irradiate the filter state checking portion with light from the first side of the nozzle shaft in the axially orthogonal direction.

11. The component mounting device according to claim 10, further comprising:
- a light detector configured to detect light that has been radiated by the light irradiator and has passed through the filter state checking portion; and
- a controller configured to perform a control to detect quality of the inserted state of the filter based on a light detection result of the light detector.

12. The component mounting device according to claim 11, wherein
- the light detector includes an imager configured to image the component suctioned by the nozzle in the axially orthogonal direction; and
- the controller is configured to perform a control to detect the quality of the inserted state of the filter based on a result of imaging of the filter state checking portion by the imager.

13. The component mounting device according to claim 1, further comprising:
- a light irradiator configured to irradiate the filter state checking portion with light from the first side of the nozzle shaft in the axially orthogonal direction.

14. The component mounting device according to claim 13, further comprising:
- a light detector configured to detect light that has been radiated by the light irradiator and has passed through the filter state checking portion; and
- a controller configured to perform a control to detect quality of the inserted state of the filter based on a light detection result of the light detector.

15. The component mounting device according to claim 14, wherein
- the light detector includes an imager configured to image the component suctioned by the nozzle in the axially orthogonal direction; and
- the controller is configured to perform a control to detect the quality of the inserted state of the filter based on a result of imaging of the filter state checking portion by the imager.

16. The component mounting device according to claim 15, wherein the controller is configured to perform a control to detect, as the quality of the inserted state of the filter, that the inserted state of the filter is a normal state, the inserted state of the filter is an over-inserted state, that the inserted state of the filter is an under-inserted state, and that the inserted state of the filter is a non-inserted state.

17. The component mounting device according to claim 15, wherein the controller is configured to perform a control to detect the quality of the inserted state of the filter at a time of production start and at a time of replacement of the filter.

18. The component mounting device according to claim 14, wherein the controller is configured to perform a control to detect, as the quality of the inserted state of the filter, that the inserted state of the filter is a normal state, the inserted state of the filter is an over-inserted state, that the inserted state of the filter is an under-inserted state, and that the inserted state of the filter is a non-inserted state.

19. The component mounting device according to claim 18, wherein the controller is configured to perform a control to detect the quality of the inserted state of the filter at a time of production start and at a time of replacement of the filter.

20. The component mounting device according to claim 14, wherein the controller is configured to perform a control to detect the quality of the inserted state of the filter at a time of production start and at a time of replacement of the filter.

* * * * *